(12) United States Patent
Özden

(10) Patent No.: US 11,252,519 B2
(45) Date of Patent: Feb. 15, 2022

(54) HEARING DEVICE WITH EMBEDDED INTEGRATED CIRCUIT CHIPS

(71) Applicant: GN HEARING A/S, Ballerup (DK)

(72) Inventor: Sinasi Özden, Ballerup (DK)

(73) Assignee: GN HEARING A/S, Ballerup (DK)

( * ) Notice: Subject to any disclaimer, the term of this patent is extended or adjusted under 35 U.S.C. 154(b) by 6 days.

(21) Appl. No.: 16/681,767

(22) Filed: Nov. 12, 2019

(65) Prior Publication Data

US 2020/0178006 A1 Jun. 4, 2020

(30) Foreign Application Priority Data

Nov. 30, 2018 (DK) .................................. 18209634.7

(51) Int. Cl.
*H04R 25/00* (2006.01)
*H01Q 1/27* (2006.01)
*H05K 3/46* (2006.01)
*H05K 9/00* (2006.01)

(52) U.S. Cl.
CPC .......... *H04R 25/554* (2013.01); *H01Q 1/273* (2013.01); *H04R 25/60* (2013.01); *H05K 3/4691* (2013.01); *H04R 2225/021* (2013.01); *H04R 2225/51* (2013.01); *H05K 9/0075* (2013.01)

(58) Field of Classification Search
None
See application file for complete search history.

(56) References Cited

U.S. PATENT DOCUMENTS

| 4,783,815 A * | 11/1988 | Buttner ................ H05K 3/4623 381/324 |
| 8,617,934 B1 | 12/2013 | Minervini |
| 2009/0136068 A1* | 5/2009 | Koo ....................... H04R 25/60 381/322 |
| 2011/0188687 A1* | 8/2011 | Song ...................... H04R 25/00 381/321 |
| 2016/0057546 A1* | 2/2016 | Lyon ..................... H04R 25/609 381/312 |

(Continued)

FOREIGN PATENT DOCUMENTS

| DE | 36 39 402 A1 | 5/1988 |
| DE | 3639402 A1 | 5/1988 |
| EP | 2 063 666 A2 | 5/2009 |

(Continued)

OTHER PUBLICATIONS

Extended European Search Report dated May 29, 2019 for corresponding European Application No. 18209634.7.

(Continued)

*Primary Examiner* — Harry S Hong
(74) *Attorney, Agent, or Firm* — Vista IP Law Group, LLP

(57) ABSTRACT

A hearing device includes: a multi-chip assembly including a plurality of integrated circuit chips, the plurality of integrated circuit chips including one or a combination of a wireless communication chip, a power management chip, and a signal processing chip; wherein the multi-chip assembly comprises: a first layer having a surface, a spacer layer being configured to accommodate one or more of the plurality of integrated circuit chips as one or more embedded chips, and a ground layer below the first layer and the spacer layer, and a first shielding layer between the spacer layer and the first layer.

23 Claims, 8 Drawing Sheets

(56) References Cited

U.S. PATENT DOCUMENTS

2018/0098162 A1* 4/2018 Vang .................... H04R 25/558
2019/0166693 A1* 5/2019 Gebhardt ............. H04R 25/609

FOREIGN PATENT DOCUMENTS

| EP | 2063666 A2 | 5/2009 |
| EP | 2 200 120 A2 | 6/2010 |
| EP | 2200120 A2 | 6/2010 |
| EP | 2 200 120 A3 | 6/2011 |
| EP | 2 063 666 A3 | 5/2013 |
| WO | WO 2006/122836 | 11/2006 |
| WO | WO 2006/122836 A2 | 11/2006 |
| WO | WO 2006/122836 A3 | 11/2006 |

OTHER PUBLICATIONS

Foreign Communication for EP Patent Appln. No. 18209634.7 dated May 26, 2021.

* cited by examiner

HEARING DEVICE WITH EMBEDDED INTEGRATED CIRCUIT CHIPS

RELATED APPLICATION DATA

This application claims priority to, and the benefit of, European Patent Application No. 18209634.7 filed on Nov. 30, 2018. The entire disclosure of the above application is expressly incorporated by reference herein.

FIELD

The present disclosure relates to hearing devices, such as hearing devices for compensating a hearing loss of a user, particularly hearing devices having wireless communication capabilities and thus hearing devices comprising antennas for communication.

The present disclosure further relates to a hearing device configured to communicate using magnetic induction and/or to communicate through the use of radio frequencies. The hearing device may be used in a binaural hearing device system. During operation, the hearing device is worn in or at the ear of a user for alleviating a hearing loss of the user.

BACKGROUND

Hearing devices are very small and delicate devices and comprise many electronic and metallic components contained in a housing or shell small enough to fit in the ear canal of a human or be located behind the outer ear. The many electronic and metallic components in combination with the small size of the hearing device housing or shell impose high design constraints on antennas to be used in hearing devices with wireless communication capabilities, both MI antennas and RF antennas.

Moreover, particularly the RF antenna in the hearing device must be designed to achieve a satisfactory performance despite these limitations and other narrow design constraints imposed by the size of the hearing device.

The developments within wireless technologies for hearing devices and the continuous efforts to make hearing devices smaller and more cost effective to manufacture has led to the use of flexible carriers incorporating one or more antennas in hearing devices.

Still further, in binaural hearing device systems, the requirements to the quality of the communication between the hearing devices in the binaural hearing device system are ever increasing, and include demands for low latency and low noise, increasing the requests for effective antennas in the hearing devices.

Still further, the hearing devices typically includes an amount of (litze) wires that may degrade performance of antennas positioned inside the hearing devices.

All these demands proves difficult to solve with existing devices, as the present communication capabilities are insufficient.

SUMMARY

It is an object to provide a hearing device communication capability. The communication capability may be through the use of radio frequency (RF)-antenna functionality, such as Bluetooth, at low cost and low device complexity. The communication capability may be through the use of magnetic induction.

It is also an object to improve the wireless communication capabilities, such as improved wireless communication capabilities between two hearing devices worn in or behind opposite ears of the user, and/or between a hearing device and an accessory device, such as a smart phone. The hearing devices may be configured for wireless communication in an ISM frequency band. The RF antenna functionality may be implemented for operation at a frequency of at least 400 MHz, such as at a frequency of between 800 MHz and 6 GHz. The hearing devices may additionally or alternatively be configured for wireless communication in a frequency range from 2 MHz-30 MHz.

Radio connectivity between hearing devices allows for advanced binaural signal processing when the important ear-to-ear (E2E) link is ensured. Furthermore, the hearing devices may be connected to a plethora of accessories, either body-worn or being placed in the user's proximity, and hence to the Internet as part of the so-called Internet-of-things (IoT). However, it is challenging but of key importance to ensure a stable E2E link. The 2.4 GHz ISM (Industrial, Scientific, Medical) band is preferred due to the presence of many harmonized standards for low-power communications, such as Bluetooth Low Energy (BLE) or ZigBee, its worldwide availability for industrial use, and the trade-off between power consumption and achievable range. The E2E link is particularly demanding in terms of requirements on the wearable antenna design and performance. In fact, to achieve a good on-body performance the antenna may exhibit optimal radiation efficiency, bandwidth, polarization, and radiation pattern, while the physical volume available for the design is extremely reduced, as most times space comes at a premium in wearable devices such as hearing devices, in particular in-the-ear (ITE) hearing devices. Furthermore, mass production and industrial design needs provide a desire that the antenna may also be low-profile, lightweight, and inexpensive to manufacture. The antenna polarization characteristic may be an important performance parameter. More overall constrains may also be relevant. In fact, antenna efficiency may be seriously jeopardized by the proximity of the antenna to the human head, as the body tissues have very high losses around 2.4 GHz due to their high water content. This may critically impact the overall performance given the magnitude of the drop-in efficiency and the fact that the hearing device radios operate in an ultra-low-power regime. Another issue threatening antenna efficiency may be the small volume available for the design, as this necessarily brings the antenna in close physical, hence, as well as electromagnetic, proximity of other parts of the device, with a strong likelihood of coupling to them. A large bandwidth is hard to achieve as well for an electrically small antenna (ESA) due to its fundamental limits. The bandwidth may cover at least the whole 2.4 GHz ISM band, but a larger bandwidth may help to compensate for the detuning of the antenna caused by the effects of the body, effects which varies across users.

Magnetic induction, or near-field magnetic induction (NFMI), typically provides communication, including transmission of voice, audio and data, in a range of frequencies between 2 MHz and 30 MHz. At these frequencies the electromagnetic radiation propagates through and around the human head and body without significant losses in the tissue. The magnetic induction antenna operating at such frequencies could be susceptible to noise originating from the hearing device electric components.

In accordance with the present disclosure, the above-mentioned and other objects are obtained by the disclosed hearing device. The hearing device comprises a multi-chip assembly including a plurality of integrated circuit chips, the plurality of integrated circuit chips including at least one of a wireless communication chip, a power management chip, and a signal processing chip. The hearing device may comprise a battery for supplying power. In some embodiments, the multi-chip assembly comprises a plurality of layers including a first layer having a surface, and a spacer layer being configured to accommodate at least one of the plurality of integrated circuit chips as an embedded chip. A ground layer may be provided below the first layer and the spacer layer. The multi-chip assembly may further comprise at least one shielding layer, including a first shielding layer, the first shielding layer being provided between the spacer layer and the first layer. The first shielding layer may be provided above the spacer layer. The first shielding layer may provide a shielding of the embedded chip. The ground layer may provide a shielding of the embedded chip. The first shielding layer and the ground layer may in combination provide a shielding of the embedded chip.

In some embodiments, the shielding layer reduces unwanted electromagnetic radiation from the embedded chip, and thus reduces unwanted electromagnetic radiation from the multi-chip assembly. In some embodiments, the unwanted electromagnetic radiation includes noise, in some embodiments, the unwanted electromagnetic radiation includes noise from ripple effects of power management units.

In some embodiments, the hearing device comprises an MI antenna facilitating communication via magnetic induction. In some embodiments, the hearing device comprises an RF antenna facilitating communication via radio frequencies. In some embodiments, the hearing device comprises an MI antenna facilitating communication via magnetic induction and an RF antenna facilitating communication via radio frequencies. In some embodiments, the MI antenna and/or the RF antenna are provided within the hearing device. In some embodiments, a part of the antenna, MI and/or RF, may protrude outside of a hearing device housing, such as outside of a hearing device shell.

Some hearing devices comprises a number of wires, such as litze wires, interconnection electrical hearing device components. Such wires may influence performance for antennas provided inside the hearing device, such as for antennas provided at least partly inside the hearing device. Such influence may degrade performance for both an RF antenna and an MI antenna provided inside the hearing device. In some embodiments, the wires may be randomly positioned from product to product rendering control of the influence on and potential degradation of antenna performance challenging. It is therefore an advantage of the present disclosure that the number of wires may be reduced. By reducing the number of wires it will be possible to improve the performance of the RF antenna and/or the MI antenna as provided in the hearing device. Particularly for MI antennas, the Signal-to-noise ration may be reduced by reducing the number of or removing wires, which may radiate noise in the same frequency in which the MI antenna is operating. Particular for RF antennas, antenna performance may be improved by reducing the number of wires or removing wires as there will be no or fewer wires to act as ground plane extension for the RF antenna. Thus, common mode radiation may be reduced.

In some embodiments, the spacer layer is provided between a second layer and a third layer of the plurality of layers.

The ground layer may be electrically insulated from at least the first layer by means of an insulating layer. A connection to the ground layer may be provided via through-holes in the first layer, the spacer layer and the insulating layer, and additionally through any second and third layers.

In some embodiments, the second layer is the shielding layer. In some embodiments, the third layer is the insulating layer. Thus, the spacer layer may be provided between second layer and the third layer, such as between the shielding layer and the insulating layer.

In some embodiments, the hearing device comprises one or more microphones configured to receive an audio signal. The audio signal is provided to a signal processor configured to process the audio signal for compensating a hearing loss of a user. The signal processor may comprise elements such as amplifiers, compressors and noise reduction systems, etc. for processing the audio signal to compensate a hearing loss of a user. The signal processing chip may comprise the signal processor.

In some embodiments, the at least one embedded chip includes a controlling chip, such as an integrated circuit chip configured to control the operation and/or the power supply to another component, such another component not provided in the multi-chip assembly.

In some embodiments, the chip is an electronic component. In some embodiments, the embedded chip is an embedded electronic component. In some embodiments, the embedded chip is an active device or an active electronic component.

In some embodiments the embedded chip is a shielded embedded chip, such as an electromagnetically shielded embedded chip. The shielding provided by the plurality of shielding layers, including the first shielding layer.

In some embodiments, the first shielding layer provides a shielding of the embedded electronic component. The ground layer may provide a shielding of the embedded electronic component. The first shielding layer and the ground layer may in combination provide a shielding of the embedded electronic component.

In some embodiments, the at least one embedded chip includes the wireless communication chip. In some embodiments the at least one embedded chip includes the power management chip.

The plurality of layers including the first layer having a surface, the second layer, the third layer, the spacer layer, the insulating layer and the ground layer, may be provided as a multilayer printed circuit board, a multilayer flexible printed circuit board, etc. In some embodiments, the multi-chip assembly comprises a printed circuit board, PCB, or a flexible printed circuit board, FPCB. In some embodiments, the layers are single-sided layer, in some embodiments the layers are double sided layer. In some embodiments, the multi-chip assembly printed circuit board, comprises both single-sided layers and double-sided layers.

In some embodiments, the first layer having a surface and the second layer are the same layer. In some embodiments, the first layer has a conductive surface. In some embodiments the surface of the first layer is configured for mounting electronic components thereon. The surface of the first layer may be configured for surface mount technology, SMT.

In some embodiments, the spacer layer provides an opening configured to accommodate the at least one of the plurality of integrated circuit chips. The spacer layer may comprise one or more spacer elements, such as spacer elements being configured to provide a stand-off distance between the third layer and the second layer. In some embodiments the opening is provided in between the spacer elements. The spacer layer may be a mechanical spacer layer. The thickness of the spacer layer may correspond to the thickness of the components, chips, to be embedded.

In some embodiments, the embedded chip is mounted onto the third layer. It is envisaged that the embedded chip may be mounted onto the third layer in any known way, including bonding, soldering, gluing, surface mount technology, etc. The embedded chip may be a bare die, the embedded chip may be mounted using flip chip bonding, wire bonding, etc. The embedded chip may be a packaged chip, such as a pre-packaged chip and may be mounted onto the third layer using any known technique, such as using pins, leads, ball grid arrays, etc.

In some embodiments, the plurality of shielding layers are provided above and/or below the embedded chip, the plurality of shielding layers, including the first shielding layer, reduces electromagnetic emission from the at least one embedded chip. The shielding layer may be an electromagnetic shielding layer. The shielding layer may be configured to shield electromagnetic radiation from the at least one embedded chip. The shielding layer may be configured to contain electromagnetic radiation from the at least one embedded chip. In some embodiment, the electromagnetic radiation from the at least one embedded chip is reduced or limited by the shielding layer so that the electromagnetic radiation does not propagate to the surface of the first layer.

In some embodiments, the shielding layer is an electrically insulating layer. In some embodiments, the shielding layer is a layer of an electric conductive material, such as copper. The shielding layer may be an electromagnetic shielding layer. In some embodiments, the shielding layer may comprise a coated layer, such as a layer coated by a conductive coating, such as copper, such as conductive ink, the shielding layer may be a metallic layer, such as a sheet metal layer, etc.

In some embodiments, a shielding layer may be configured as a ground layer, such as a ground layer forming a ground plane for the multi-chip assembly.

In some embodiments, the multi-chip assembly comprises a first embedded chip and a second embedded chip, and wherein a shielding is provided between the first embedded chip and the second embedded chip. In some embodiments, the first embedded chip and the second embedded chip are accommodated by the same spacer layer. In some embodiments, the first embedded chip and the second embedded chip are accommodated by different spacer layers. In some embodiments, the multi-chip assembly comprises a first spacer layer for accommodating the first embedded chip and a second spacer layer for accommodating the second embedded chip. A shielding layer may be provided between the first spacer layer and the second spacer layer.

In some embodiments, the multi-chip assembly includes a plurality of one or more integrated circuit chips, the plurality of integrated circuit chips including at least one of a wireless communication chip, a power management chip, and a signal processing chip. The multi-chip assembly may be provided at a carrier board. The multi-chip assembly may be termed a hybrid. The multi-chip assembly may comprise a multi-layered structure for accommodating at least some of the hearing device electronic components. The multi-chip assembly may comprise a multi-layered printed circuit board.

The multi-chip assembly may be any assembly of integrated circuits, semiconductor dies and/or other discrete electronic components. The multi-chip assembly comprises two or more electronic components integrated in the assembly. The electronic components may be provided as "bare dies"; however it is envisaged that some, or all, electronic components of the multi-chip assembly may be pre-packaged while other, or none, of the electronic components of the multi-chip assembly may be mounted as bare dies or chips or vice versa. The multi-chip assembly may referred to as a hybrid multi-chip assembly as a number of electronic components are inter-connected. The multi-chip assembly may comprise a multi-layered structure for accommodating at least some of the hearing device electric components. The multi-chip assembly may comprise a multi-layered printed circuit board. The electronic components are integrated and mounted onto a substrate so that the multi-chip assembly may be handled as a single assembly comprising multiple electronic components. In some embodiments, the multi-chip assembly is provided as a single component for mounting in a hearing device.

In some embodiments, the first embedded chip is the power management chip and the second embedded chip is the wireless communication chip.

In some embodiments, the hearing device comprises a magnetic induction antenna and/or an RF antenna.

In some embodiments, the power management chip comprises regulators for regulating the power. However, such regulators typically contribute with switching noise, or ripple, which is above the noise floor for a magnetic induction antenna. The regulator switching may result in voltage fluctuation on the output voltage. The regulator switching may result in current fluctuation on the output current. Such voltage and current fluctuations, ripple effects, contribute to the overall noise in the hearing device. A magnetic induction antenna typically has a noise floor of below 50 µV at any pads of the magnetic induction antenna, such as a noise floor below 20 µV, such as a noise floor of 17 µV, such as a noise floor of about 17 µV, thus, the magnetic induction antenna is sensitive to noise in the hearing device, such as noise stemming from electronic components of the hearing device.

It is an advantage of embedding one or more chips in multi-chip assembly, in that noise from the multi-chip assembly may be reduced. It is an advantage of reducing noise from the multi-chip assembly without having to provide a so-called shielding can around the multi-chip assembly.

It is an advantage of one or more embodiments of the present disclosure that a reduction of noise and improvement of performance for antennas and the wireless communication systems as such, is enabled by embedding chips in the multi-chip assembly, e.g. using embedded die technology.

The multi-chip assembly may comprise a plurality of layers, such a 3 layer, 5 layers, such as at least 10 layers, such as up to 15 layers, such as 12 layers, such as between 10 and 15 layers. It is hereby possibly to shield embedded chips with multiple ground layers to decrease electromagnetic radiation, such as the E-field emitted, from the embedded chip, including e.g. from an embedded switching NP chip.

It is a further advantage of one or more embodiments of the present disclosure that by embedding chips which would otherwise have been provided at a surface of the multi-chip assembly, or elsewhere in the hearing device, the one or more microphones may be provided on the surface of the multi-chip assembly. Thereby, the need for additional wires for connecting e.g. the one or more microphones to the multi-chip assembly, such as to the signal processor of the multi-chip assembly, may be reduced or eliminated. Likewise, other electrical components, such as the MI chip could also be provided at the surface of the multi-chip assembly, further reducing the need for additional wires.

In some embodiments, one or more decoupling capacitors are embedded inside the multi-chip assembly to reduce any length of radiation traces. The decoupling capacitors may be connected to the embedded die(s).

In some embodiments, the wireless communication unit, or the wireless communication chip, is configured for wireless communication, including wireless data communication, including wireless audio communication, and is interconnected with an antenna for emission and reception of an electromagnetic field or a magnetic field; the wireless communication chip comprises a transmitter, a receiver, a transmitter-receiver pair, such as a transceiver, a radio unit, etc.; the wireless communication chip is configured for communication using any protocol as known for a person skilled in the art.

In some embodiments, the hearing device comprises a magnetic induction antenna and wherein a first wireless communication chip is a magnetic induction control chip.

In some embodiments, the hearing device is configured to communicate using magnetic induction, such a near-field magnetic induction. In some embodiments, the magnetic induction control chip is an integrated circuit implementing magnetic induction transmit and receive functions, such as magnetic induction transmit and receive control functions. The magnetic induction control chip is interconnected to the magnetic induction antenna e.g. via electrical wires or via electrical conductive traces on a support substrate. The hearing device comprising the magnetic induction control chip and the magnetic induction antenna is being configured to communicate using magnetic induction, such a near-field magnetic induction. The magnetic induction antenna may be a magnetic induction coil. The magnetic induction control chip may be configured to control power supply to the magnetic induction antenna.

In some embodiments, the magnetic induction control chip is configured to apply any modulation schemes including amplitude modulation, phase modulation, and/or frequency modulation to the data signal to be communicated via magnetic induction so that data are modulated onto the magnetic field emitted from the magnetic induction antenna. The magnetic induction control chip may comprise circuits, such as low noise amplifiers (LNA), mixers and filters. The magnetic induction control chip may also comprise peripheral digital blocks such as frequency dividers, codec blocks, demodulators, etc.

In some embodiments, the magnetic induction antenna is furthermore configured for receiving a magnetic field communicated by another electronic device, such as via a magnetic induction antenna of another electronic device, and providing the received data signal to the magnetic induction control chip. The magnetic induction control chip is configured to demodulate the received signal. In some embodiments the magnetic induction control chip is configured as a transceiver. In some embodiments, the magnetic induction control chip is configured to receive and transmit data at a particular frequency.

The data communicated may include data, audio, voice, settings, information, etc.

The magnetic induction antenna and the magnetic induction control chip may be configured to operate at a frequency below 100 MHz, such as at below 30 MHz, such as below 15 MHz, during use. The magnetic induction antenna may be configured to operate at a frequency range between 1 MHz and 100 MHz, such as between 1 MHz and 15 MHz, such as between 1 MHz and 30 MHz, such as between 5 MHz and 30 MHz, such as between 5 MHz and 15 MHz, such as between 10 MHz and 11 MHz, such as between 10.2 MHz and 11 MHz. The frequency may further include a range from 2 MHz to 30 MHz, such as from 2 MHz to 10 MHz, such as from 2 MHz to 10 MHz, such as from 5 MHz to 10 MHz, such as from 5 MHz to 7 MHz.

However, it is envisaged that the hearing device as herein disclosed is not limited to operation in such a frequency band, and the hearing device may be configured for operation in any frequency band.

In some embodiments, the impedance of the magnetic induction antenna is selected to optimize communication. The magnetic induction antenna may in some examples have an impedance larger than a threshold inductance, such as an inductance larger than 2 pH, such as an inductance larger than 3 pH, such as larger than 3.5 pH, such as about 3.9 pH or an inductance of up to 5 pH. The inductance may be selected to be between 2 pH and 5 pH, such as between 3 pH and 4 pH.

In some embodiments, the magnetic induction antenna has a longitudinal direction being parallel to an ear-to-ear axis of a user of the hearing device, when the hearing device is provided in the intended operational position at the ear of a user, the longitudinal direction may be the axis along which axis coil windings of the magnetic induction antenna are provided. In one or more embodiments, the magnetic induction antenna has a longitudinal extension in a direction being parallel to, or being substantially parallel to, or being 0/180 degrees+/−35 degrees, to an ear-to-ear axis of a user, when the hearing device is worn in its operational position during use.

In some embodiments, the hearing device comprises an RF antenna, and wherein a second wireless communication chip is an RF wireless communication chip.

The hearing device may comprise a magnetic induction antenna. The hearing device may comprise an RF antenna. The hearing device may comprise both a magnetic induction antenna and an RF antenna.

In some embodiments, the wireless communication chip is interconnected with an RF antenna for emission and reception of an electromagnetic field. The wireless communication chip interconnected with an RF antenna may be configured for communicating with another electronic device. The data communicated via the wireless communication chip may include data, audio, voice, settings, information, etc.

Typically, the length of the RF antenna is defined in relation to a wavelength $\lambda$ of the electromagnetic field to be emitted from and/or received by the hearing device when it is positioned at its intended operational position at the ear of a user. The hearing device is typically configured to emit and/or receive electromagnetic radiation within a specific frequency range or band. In some embodiments, the RF frequency band is provided so as to include a resonance frequency for the antenna elements. Typically, the length of the antenna elements are optimized for use within such specific RF frequency bands, such as in a band about, or extending from, a peak resonant frequency.

For an RF antenna to be resonant, the length of the resonating element in free air is selected to correspond to an odd multiple of a quarter-wavelength, $\lambda/4$, of a wavelength $\lambda$ of the electromagnetic radiation to be emitted from the hearing device.

Typically, the length of the RF antenna is selected to optimize the RF antenna for use at a specific frequency or within a specific frequency band, such as selected to provide an optimum resonance at a specific frequency, such as within a desired frequency band. Typically, the antenna is optimized for ISM bands, including cellular and WLAN bands, such as for GSM bands or WLAN bands.

In some embodiments the RF antenna is an electrical antenna. In some embodiments, the RF antenna is a monopole antenna. In some embodiments, the RF antenna is a resonant antenna, such as an RF antenna configured to emit an electromagnetic field in a wavelength range about a resonance frequency.

The frequency band may be an RF frequency band comprising a frequency selected from the following frequencies, such as comprising 433 MHz, 800 MHz, 915 MHz, 1800 MHz, 2.4 GHz, 5.8 GHz, etc. Thus, the RF frequency band may be selected as an ISM band, such as a GSM band or a WLAN band comprising any one or more of these frequencies.

The hearing devices as disclosed herein may be configured for operation in an ISM frequency band. Preferably, the RF antenna is configured for operation at a frequency of at least 400 MHz, such as of at least 800 MHz, such as of at least 1 GHz, such as at a frequency between 1.5 GHz and 6 GHz, such as at a frequency between 1.5 GHz and 3 GHz such as at a frequency of 2.4 GHz. The antenna may be optimized for operation at a frequency of between 400 MHz and 6 GHz, such as between 400 MHz and 1 GHz, between 800 MHz and 1 GHz, between 800 MHz and 6 GHz, between 800 MHz and 3 GHz, etc.

However, it is envisaged that the hearing device as herein disclosed is not limited to operation in such a frequency band, and the hearing device may be configured for operation in any frequency band.

The wireless communication chip may be configured for communication using any protocol as known for a person skilled in the art, including, including Bluetooth, including Bluetooth Low Energy, Bluetooth Smart, etc., WLAN standards, manufacture specific protocols, such as tailored proximity antenna protocols, such as proprietary protocols, such as low-power wireless communication protocols, such as CSR mesh, etc.

It is an advantage that by one or more embodiments as presented, an RF antenna and a magnetic induction antenna may be provided in the hearing device. To have an RF antenna and a magnetic induction antenna provided in the hearing device increases the wireless communication capabilities of the hearing device. However, providing both an RF antenna and a magnetic induction antenna within a hearing device, with the restrictions as set out above pertaining to size, noise, EMC regulations, etc. has typically led to an increased size of the hearing devices to obtain the improved communication capabilities.

Furthermore, in present day communication systems, numerous different communication systems communicate at or about 2.4 GHz, and thus there is also a significant environmental electromagnetic noise in the frequency range at or about 2.4 GHz. It is an advantage that for some applications for which the noise may be acceptable, for example for data communication, an RF antenna may be used. For other applications, in which a high noise level may impact the transmission significantly, a magnetic induction antenna may be used. For example, the magnetic induction antenna may be used for streaming of audio.

In some embodiments, the RF antenna is configured for data communication at a first bit rate. In one or more embodiments, the magnetic induction coil is configured for data communication at a second bit rate, the second bit rate being larger than the first bit rate, such as by a factor 10, such as by a factor 30, a factor 50, a factor 100, etc.

It is an advantage of using magnetic induction that typically low latency may be obtained. Especially when streaming audio, it is of importance to keep the latency low, to avoid delays noticeable by a user. Typically, a delay of less than 100 ms, such as of less than 50 ms, such as of less than 25 ms, such as of less than 10 ms, such as of less than 5 ms, such as of less than 1 ms, may be obtained by use of magnetic induction for communication.

It is a further advantage of using magnetic induction for example for communicating between a first hearing device and a second hearing device in a binaural system that for the low frequencies, i.e. typically below 100 MHz, and corresponding long wavelengths, the head is not considered as a significant obstacle for the electromagnetic radiation emitted by the second antenna, thus, the reduction of electromagnetic radiation due to tissue absorption is reduced when the frequency is reduced.

In some embodiments, the magnetic induction antenna interconnected with the magnetic induction control chip, such as the first wireless communication chip or unit, is configured to communicate with another hearing device of a binaural hearing device.

In some embodiments, the RF antenna interconnected with the RF wireless communication chip, such as the second wireless communication chip or unit, is configured to communicate with body external devices, such as accessory devices.

In some embodiments, the magnetic induction control chip is provided as an embedded chip and the magnetic induction antenna is provided at the surface of the first layer, the first shielding layer and/or the further shielding layers providing a shield between the magnetic induction control chip and the magnetic induction antenna.

By embedding the magnetic induction control chip in the multi-chip assembly and providing a shielding layer in the multi-chip assembly to shield between the magnetic induction control chip and a magnetic induction antenna provided at the surface of the first layer of the multi-chip assembly enables a compact design, with reduced interference between the magnetic induction antenna and the magnetic induction control chip. It is an advantage of providing a compact design as this will further reduce the amount of wires, such as litze wires, in the hearing device which may further reduce electromagnetic interference, and thus may improve the overall EMC properties of the hearing device.

In some embodiments, the hearing device comprises one or more microphones configured to receive an audio signal.

In some embodiments, the one or more microphones are provided at the surface of the first layer, i.e. at the surface of the first layer of the multi-chip assembly. This may be an advantage as a very compact design can be obtained, however, also restricting the positioning of the multi-chip assembly to ensure that audio can be received by the microphones.

In some embodiments, the one or more microphones are provided at a carrier board. This may be an advantage as the carrier board with the one or more microphones may be positioned for optimum receipt of audio. In some embodiments, the carrier board may provide a shielding between the multi-chip assembly and the one or more microphones.

The carrier board may be comprised by a flexible board, such as a flexible printed circuit board. In some embodiments, the carrier board comprises an electromagnetic shielding layer. The electromagnetic shielding layer may be a coated layer, such as a layer coated by a conductive coating, such as copper, such as conductive ink, the electromagnetic shielding layer may be a metallic layer, such as a sheet metal layer, etc.

In some embodiments, the carrier board is configured to form an electromagnetic shield between the multi-chip assembly and the one or more microphones.

In some embodiments, electronic components mounted on the first layer include passive circuit components. In some embodiments, the passive circuit components are selected from the group consisting of resistors, capacitors, inductors, transducers and diodes.

In some embodiments, through-holes in the plurality of shielding layers are provided along one or more edges of the plurality of shielding layers. In some embodiments, through-holes, such as vias, are provided along one or more edges of the plurality of plurality of layers in the multi-chip assembly. In some embodiment, the through-holes are provided along edges of the embedded chips.

In some embodiments, the battery is interconnected with the multi-chip assembly. The battery may be any type of battery. The battery may be a flat battery, such as a button shaped battery. The battery may be circular. The battery may be a disk-shaped battery.

In some embodiments, the battery is a rechargeable battery. In some embodiments, the hearing device further comprises a re-chargeable battery regulator. In some embodiments, the rechargeable battery regulator is provided as an embedded chip. In some embodiments, a first and a second re-chargeable batter regulator is provided e.g. to obtain a desired voltage supply, such as a voltage supply being of the size intended for the power supply for the multi-chip assembly. In some embodiments, the re-chargeable battery supplies a power of 3.6 Volt, which is regulated to 1.8 Volt for the voltage supply to multi-chip assembly, and possibly further electronic components of the hearing device. In some embodiments, a first regulator is used for regulating the power from 3.6 Volt to 1.2 Volt, and a second regulator is configured for regulating the power from 1.2 Volt to 1.8. Any power conversion provides noise which influences the overall signal to noise ratio of the hearing device. It is therefore an advantage of being able to embed one or more of the rechargeable battery regulators in the multi-chip assembly to reduce noise emitted from the rechargeable battery regulator(s).

In some embodiments, the hearing device is an ITC hearing device type, a CIC hearing device type, an IIC hearing device type, a BTE hearing device type, a hearing protection device, or any combination of the types.

According to a further aspect, a binaural hearing device system is disclosed, the binaural hearing device system comprising a first hearing device configured to be provided at a first ear (e.g. left ear) of a user and a hearing device configured to the provided at a second ear of the user (e.g. right ear) and wherein one or both of the hearing devices is/are a hearing device as herein disclosed.

It should be noted that although the embedded chips are provided with an electromagnetic shield, in some embodiments, the magnetic induction control chip and/or the power management chip is provided at a first side of the battery, wherein the magnetic induction antenna is provided at a second side of the battery, wherein the first side is different from the second side. In some embodiments, the battery is configured to provide a, additional, electromagnetic shield between the magnetic induction control chip and the wireless communication chip provided at the first side of the battery and the magnetic induction antenna provided at the second side of the battery.

However, it is an advantage of the present disclosure, that the battery does not need to provide a shielding function between the magnetic induction control chip and/or the power management circuits. In some embodiments, the magnetic induction control chip and the power management circuit are provided at a first side of the battery, wherein the magnetic induction antenna is provided at the same first side of the battery.

In some embodiments, a further electromagnetic shield is provided between the magnetic induction antenna and the magnetic induction control chip, for example in the form of an encapsulation of the magnetic induction antenna, or in the form of a shield formed by a carrier, such as a carrier carrying hearing device components, such as electronic components of the hearing device.

In some embodiments, the battery may be provided closer to a second end of the hearing device than to a first end of the hearing device, and the magnetic induction antenna may be provided between the battery, such as between a center axis of the battery, and the second end of the hearing device. The wireless communication chip and the magnetic induction control chip may be provided between the battery, such as between the center axis of the battery, and the first end of the hearing device.

The first side of the battery and the second side of the battery may be opposite sides of the battery, either transversely or longitudinally.

It is an advantage of providing a dual mode antenna configuration with same components, in that the size of the hearing device may be reduced, while at the same time increasing the wireless capability.

In some embodiments, the hearing device is an ITC hearing device type, a CIC hearing device type, a BTE hearing device type, a hearing protection device, or any combination of the types. The hearing device may be a behind-the-ear hearing device. The hearing device may be provided as a behind-the-ear module. The hearing device may be an in-the-ear hearing device, such as a completely-in-the-canal hearing device. The hearing device may be provided as an in-the-ear module. Alternatively, parts of the hearing device may be provided in a behind-the-ear module, while other parts, such as the receiver, may be provided in an in-the-ear module. The hearing device may be a receiver-in-the-ear hearing device.

For a behind-the-ear hearing device, the hearing device may, when being positioned in the intended operational position behind the ear of a user, have a first side extending along a side of the head of the user, and a second side opposite to the first side. Typically, the first side and second side are longitudinal sides of the BTE hearing device. A top side interconnects the first side and the second side and is positioned facing away from the ear of the user. Typically, a bottom side likewise interconnects the first side and the second side, the bottom side facing towards the ear of the user. In some embodiments, the longitudinal axis of the magnetic induction antenna is provided extending from the first side to the second side of the behind-the-ear hearing device.

In another example, an in-the-ear hearing device has a top side. The hearing device may, when being positioned in the intended operational position in the ear of a user, have a shell extending into the ear canal, and the top side being the side of the in-the-ear hearing device facing away form the ear canal of the user. Typically, the top side will be parallel to the faceplate of an in-the-ear hearing device. Typically, a bottom side of the in-the-ear hearing device will be facing towards the ear canal of the user. In some embodiments, the longitudinal axis of the magnetic induction antenna is provided extending from the top side to the bottom side of the in-the-ear hearing device.

The signal processing chip is configured for providing a processed audio signal. The term sound and/or the term acoustic output may be understood to be an audio signal. Thus, the microphone may be configured to receive sound or an audio signal. An output transducer or speaker/receiver may be configured to provide or transmit an acoustic output or a processed audio signal, such as the processed audio signal provided by the signal processing chip. The acoustic output or processed audio signal may be provided or transmitted to an ear of the user wearing the hearing device during use.

It will be appreciated that the speaker of a hearing device is also known in the art as a "receiver". The term speaker is used herein to avoid confusion with other hearing device components.

In the present disclosure, the term "chip" is used for an integrated circuit. Typically, the chip, and thus the integrated circuit, is implemented in a semiconductor substrate, such as silicon. The chip may be referred to as an integrated circuit, an IC, or a microchip. Typically, a chip, such as the electronic circuits needed to implement a specific functionality, such as a control function, a transceiver function, etc. It is envisaged that in some embodiments, electronic circuits provided at different chips may be connected to provide a specific functionality. The use of the term "chip" for integrated circuits does not limit the term to be a single chip or die, should two chips or dies provide advantageously to provide a specific function.

The chip may implement a function. For example, a signal processing chip may implement a signal processing unit. Likewise, a wireless communication chip may implement a wireless communication unit; a power management chip may implement power management circuits including power regulators; etc. Electronic components of the hearing device may be implemented in a chip.

The present disclosure relates to different aspects including the hearing device described above and in the following, and corresponding hearing devices, binaural hearing devices, hearing devices, hearing devices, systems, methods, devices, uses and/or product means, each yielding one or more of the benefits and advantages described in connection with the first mentioned aspect, and each having one or more embodiments corresponding to the embodiments described in connection with the first mentioned aspect and/or disclosed in the appended claims.

BRIEF DESCRIPTION OF THE DRAWINGS

The above and other features and advantages will become readily apparent to those skilled in the art by the following detailed description of exemplary embodiments thereof with reference to the attached drawings, in which.

DETAILED DESCRIPTION

Figure 1A:
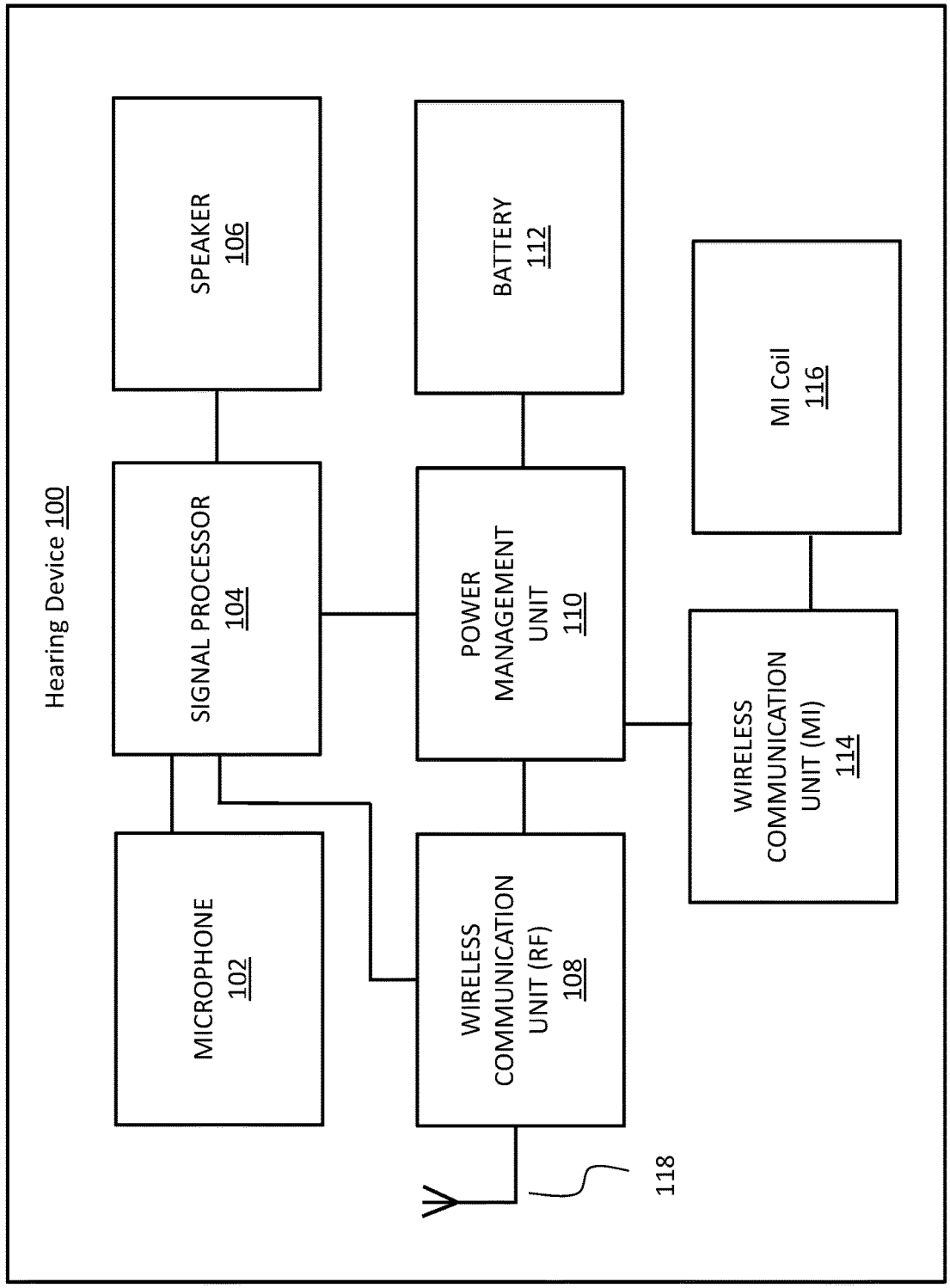
FIGS. 1a and 1b schematically illustrates an example of components in hearing device, FIGS. 2a and 2b schematically illustrates the positioning of components in the hearing device, FIG. 3 schematically illustrates an exemplary multi-chip assembly, FIG. 4 schematically illustrates exemplary positioning of through-holes, FIG. 5 schematically illustrates a further exemplary multi-chip assembly, FIG. 6 schematically illustrates a still further exemplary hearing device.

Various embodiments are described hereinafter with reference to the figures. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

Throughout, the same reference numerals are used for identical or corresponding parts.

As used herein, the term "antenna" refers to a device which converts electric power into an electromagnetic field or which converts electric power into a magnetic field. An electric antenna may comprise an electrically conductive material connected to e.g. a wireless communications chip, such as a radio chip, a receiver, a transmitter or a transceiver. A magnetic antenna may comprise a magnetic induction coil connected to e.g. a wireless communications chip, such as a radio chip, a receiver, a transmitter or a transceiver.

The claimed invention may be embodied in different forms and should not be construed as limited to the embodiments set forth herein.

A block-diagram of an embodiment of a hearing device 100 is shown in FIG. 1a. The hearing device 100 comprises a first transducer, i.e. microphone 102, to generate one or more microphone output signals based on a received an audio signal. The one or more microphone output signals are provided to a signal processor 104 for processing the one or more microphone output signals. A receiver or speaker 106 is connected to an output of the signal processor 104 for converting the output of the signal processor into a signal modified to compensate for a user's hearing impairment, and provides the modified signal to the speaker 106.

The hearing device signal processor 104 may comprise elements such as an amplifier, a compressor and/or a noise reduction system etc. The signal processor 104 may be implemented in a signal processing chip 104'. The hearing device may further have a filter function, such as compensation filter for optimizing the output signal.

The hearing device further comprises a wireless communication unit 114 interconnected with magnetic induction antenna 116 such as a magnetic induction coil. The wireless communication unit 114 and the magnetic induction antenna 116 may be configured for wireless data communication using emission and reception of magnetic field. The wireless communication unit may be implemented as a wireless communication chip 114', such as a magnetic induction control chip 114'. The hearing device 100 further comprises a power source 112, such as a battery or a rechargeable battery. Furthermore, a power management unit 110 is provided for controlling the power provided from the battery 112 to the signal processor 104, the receiver, the one or more microphones, the wireless communication unit (RF) 108, and the wireless communication unit (MI) 114. The magnetic induction antenna is configured for communication with another electronic device, in some embodiments configured for communication with another hearing device, such as another hearing device located at another ear, typically in a binaural hearing device system.

The hearing device may furthermore have a wireless communication unit 108, such as a wireless communication circuit, for wireless data communication interconnected with an RF antenna 118 for emission and reception of an electromagnetic field. The wireless communication unit may be implemented as a wireless communication chip 108'. The wireless communication unit 108, including a radio or a transceiver, connect to the hearing device signal processor 104 and the RF antenna 118, for communicating with one or more external devices, such as one or more external electronic devices, including at least one smart phone, at least one tablet, at least one hearing accessory device, including at least one spouse microphone, remote control, audio testing device, etc., or, in some embodiments, with another hearing device, such as another hearing device located at another ear, typically in a binaural hearing device system.

The signal processor 104, the wireless communication unit (RF) 108, the wireless communication unit (MI) 114 and the power management unit 110 may be implemented as signal processing chip 104', wireless communication chip (RF) 108', wireless communication chip (MI) 114' and power management chip 110', respectively.

Figure 1B:
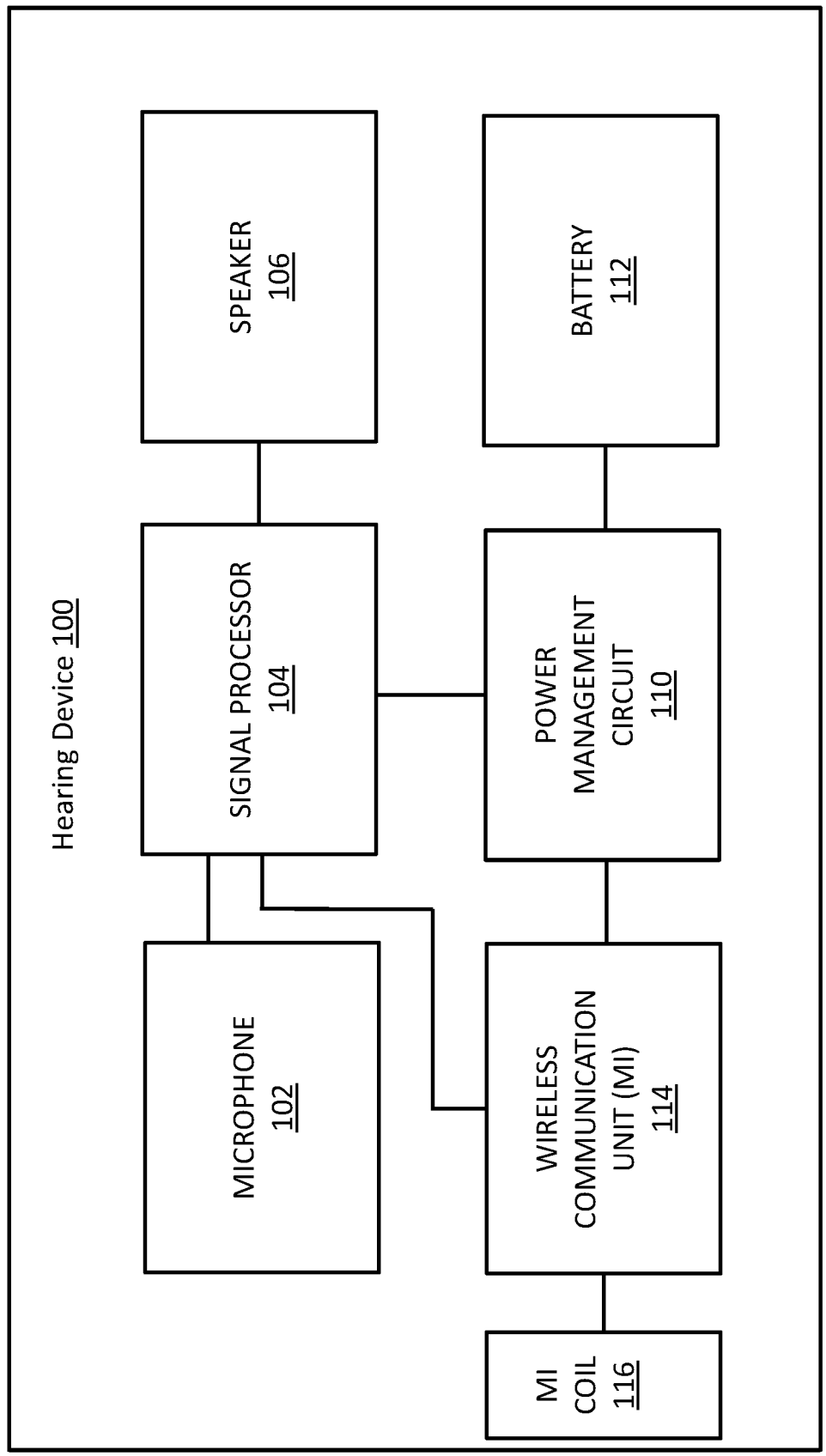

In FIG. 1b, a hearing device corresponding to the hearing device as shown in FIG. 1a is seen, except that in FIG. 1b, only one wireless communication unit 114 is present being interconnected with the magnetic induction antenna 116, the signal processor 104 and the power management unit 110.

Likewise, even though not shown, also a hearing device having only one wireless communication unit 108 being interconnected with an RF antenna for reception and emission of an electromagnetic field is envisaged.

Figure 2A:
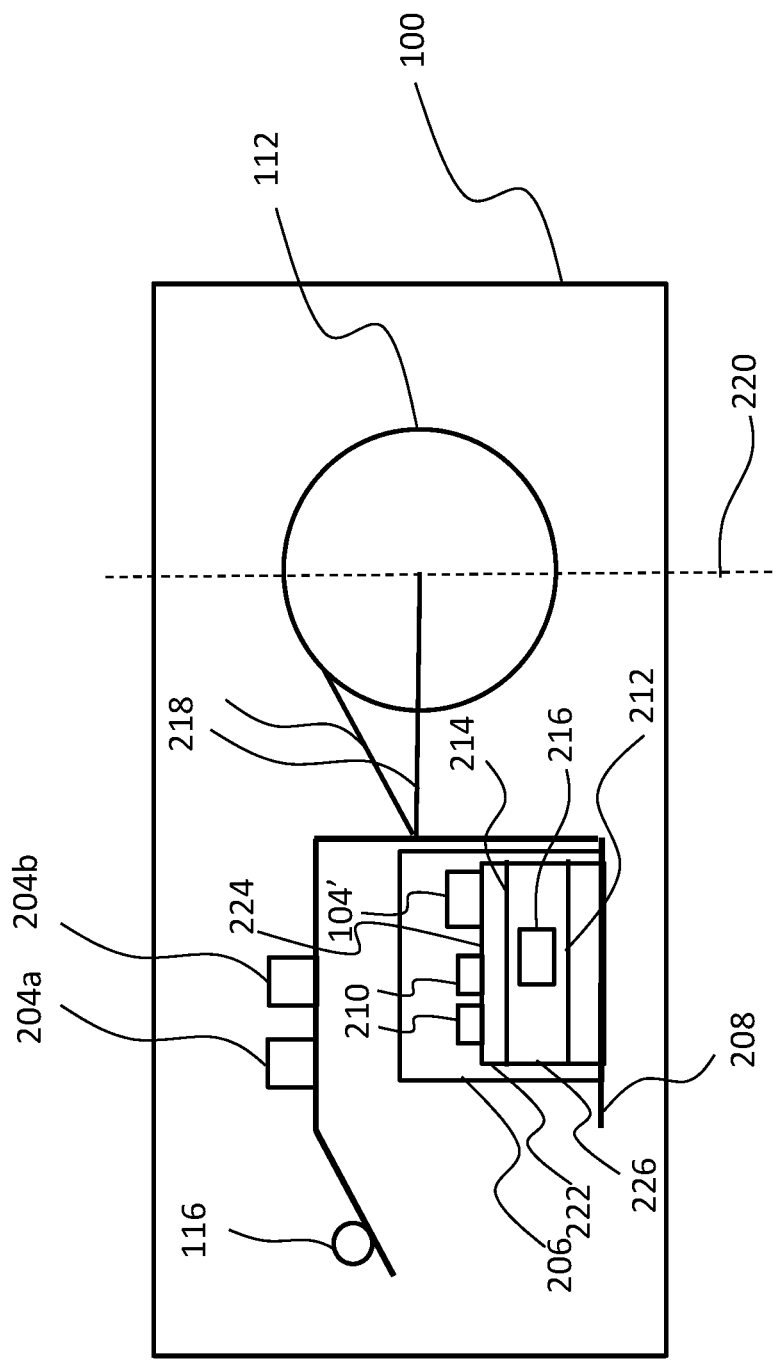
Figure 2B:
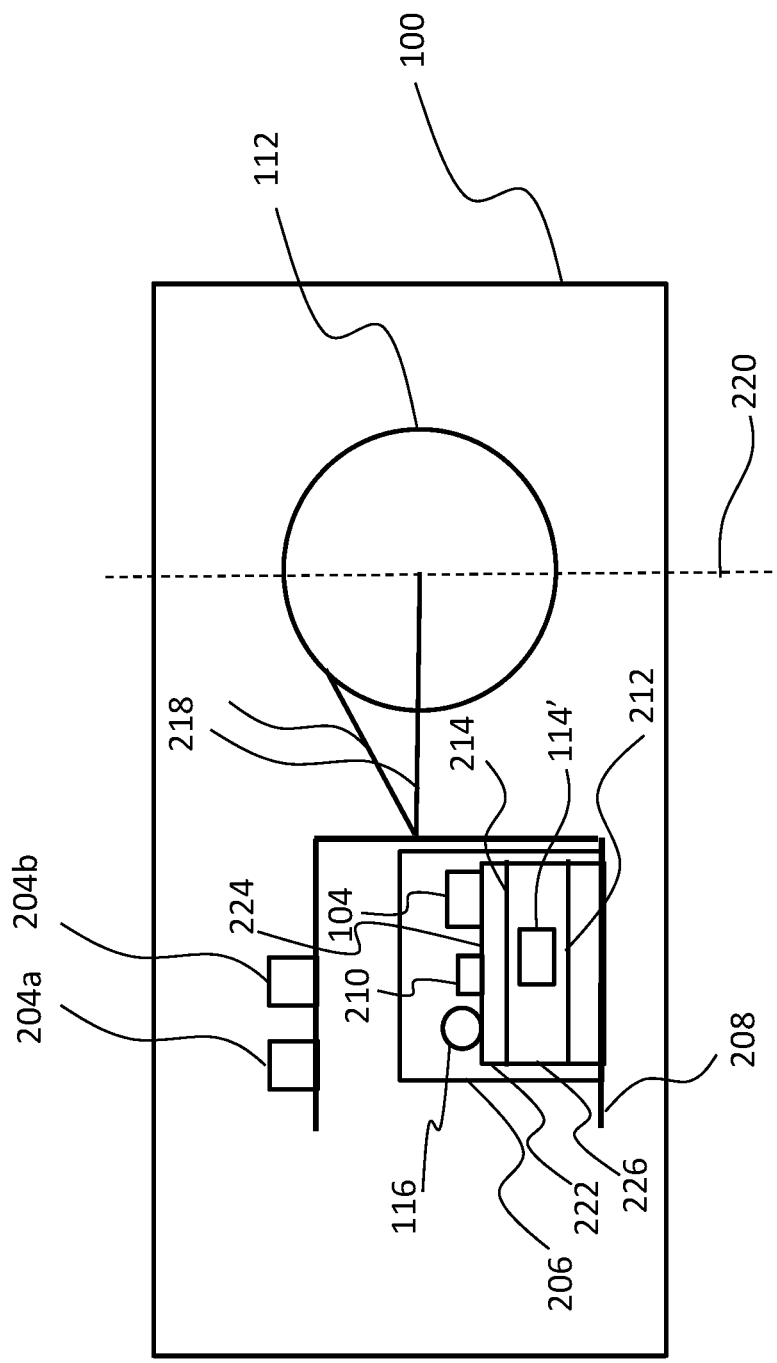

FIGS. 2a and 2b schematically illustrates an embodiment of a hearing device, the hearing device comprising a first microphone 204a, a second microphone 204b, a battery 112 with battery contacts 218, a magnetic induction antenna 116 and a multi-chip assembly 206.

The hearing device in FIGS. 2a and FIG. 2b comprises a carrier board 208 and a multi-chip assembly 206 being positioned at the carrier board 208. The multi-chip assembly 206 comprises a plurality of layers including a first layer 222 having a surface 224. The surface is configured for mounting of electronic components, and may be configured for SMT mounting of components. Electronic components 210 are mounted onto the surface 224 of the first layer 222. Also, signal processing chip 104' is mounted onto the surface 224 of the first layer 222. A spacer layer 226 is provided between the first layer 222 and a ground layer 212, of the plurality of layers. The spacer layer 226 may be configured to accommodate at least one of the plurality of integrated circuit chips as an embedded chip 216. As is seen, the ground layer 212 is provided below the first layer 222, and the spacer layer 226. The multi-chip assembly further comprises a first shielding layer 214, the first shielding layer 214 being provided between the spacer layer 226 and the first layer 222.

In FIG. 2a, the magnetic induction antenna 116 is provided at the carrier board 208 a distance from the multi-chip assembly 206. It is seen that the multi-chip assembly and the magnetic induction antenna is provided at a same side of the battery, such as at the same side of a center axis 220 of the battery. The battery contact 218 connects to the carrier board 208 to supply power to at least the multi-chip assembly provided at the carrier board 208. It is envisaged that also other connections to the battery may be made, and for example, the battery contacts may connect directly to the multi-chip assembly 206.

In FIG. 2b, the magnetic induction antenna 116 is provided at the multi-chip assembly 206. The magnetic induction antenna 116 is provided at the surface 224 of the first layer 222. The magnetic induction control chip 114' is provided as an embedded chip and accommodated by the spacer layer. The shielding layer 214 provides shielding between the magnetic induction antenna and the magnetic induction control chip 114'. The first shielding layer 214 dampens any unwanted electromagnetic radiation, such as noise, stemming from the magnetic induction control chip 114'. In some embodiments, the first shielding layer 214 provides sufficient shielding and/or damping. In some embodiments, a second shielding layer (not shown in FIG. 2b) may be provided between the first layer and the spacer layer.

Figure 3:
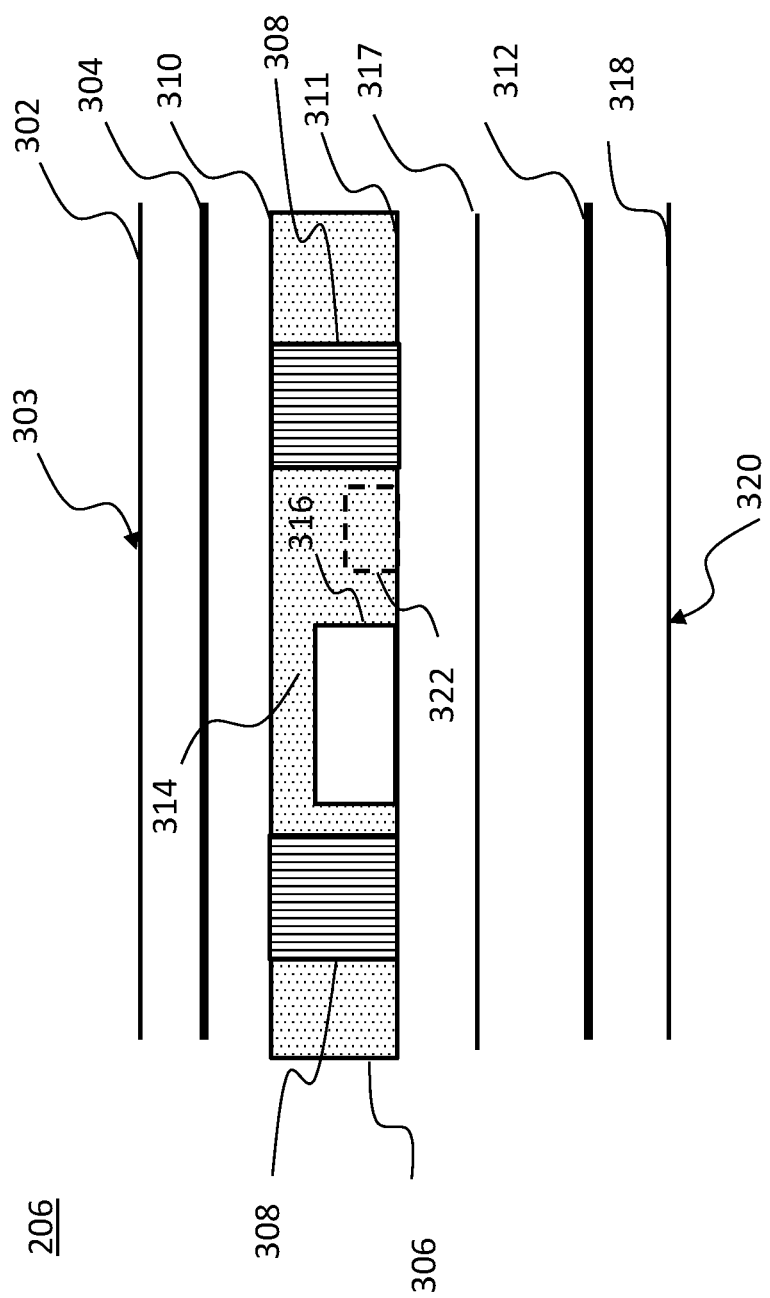

In FIG. 3, the multi-chip assembly 206 is shown in more detail. The multi-chip assembly 206 comprises a plurality of layers including a first layer 302 having a surface 303. The surface 303 is configured for mounting of electronic components, and may be configured for SMT mounting of electronic components. A spacer layer 306 is provided between the first layer 302 and a ground layer 312, of the plurality of layers. The spacer layer 306 may be configured to accommodate at least one of the plurality of integrated circuit chips as an embedded chip 316. As is seen, the ground layer 312 is provided below the first layer 302 and the spacer layer 306. The multi-chip assembly further comprises a first shielding layer 304, the first shielding layer 304 being provided between the spacer layer 306 and the first layer 302. Typically, one or more spacer elements 308 are provided to create space for the embedded chip 316. The ground layer 312 may form a ground plane, such as a ground potential for the multi-chip assembly.

In some embodiments, the spacer layer 306 provides an opening 314 configured to accommodate at least one of the plurality of embedded chips 316. The spacer layer 306 comprises one or more spacer elements 308. The opening 314, such as the height and width of the opening 314, may be defined by the one or more spacer elements 308. In some embodiments the opening is provided in between the spacer elements, inside a ring of spacer element(s), the ring having any shape, circular, rectangular, irregular, etc. The spacer elements may be mechanical spacer elements providing a mechanical spacer layer. The thickness of the spacer layer may be selected to correspond to the thickness of the components, chips, to be embedded.

In FIG. 3, the spacer layer is provided between a second layer 310 and a third layer 311 of the plurality of layers.

The first layer 302, the second layer 310 and the third layer 311 may be layers of a printed circuit board, such as of a flexible printed circuit board. The layers may comprise electrically conductive paths serving as interconnections between electronic components of multi-chip assembly.

Typically, the ground layer 312 is electrically insulated from at least the first layer by means of an insulating layer 317, and wherein connections to the ground layer 312 from are provided via through-holes in the first layer 302, the spacer layer 306 and the insulating layer 317, and also via the second layer 310 and the third layer 311.

In some embodiments, the second layer 310 is the first shielding layer 304. In some embodiments, the third layer 311 is the insulating layer 317 In some embodiments, the second layer 310 is the ground layer 312. In such an embodiment, the spacer layer provides insulation between the ground layer and the first layer. A further layer 318 may be added below the ground layer 312. The further layer 318 may be a bottom layer for the multi-chip assembly. The further layer 318 may be an insulating layer. In some embodiments the further layer 318 has a surface 320 configured for surface mounting of electronic components to provide a double-sided printed circuit board allowing for SMT mounting of electronic components on both sides of the PCB.

In some embodiments, more than one embedded chip 316, 322 may be provided in the spacer layer.

It is envisaged that a plurality of shielding layers may be provided above and/or below the embedded chip, the plurality of shielding layers, including the first shielding layer, reduces electromagnetic emission from the at least one embedded chip. In some embodiments, the ground layer 312 is a shielding layer, thus the one or more shielding layers may additionally comprise the ground layer 312. The first shielding 304 layer being different from the ground layer 312.

Figure 4:
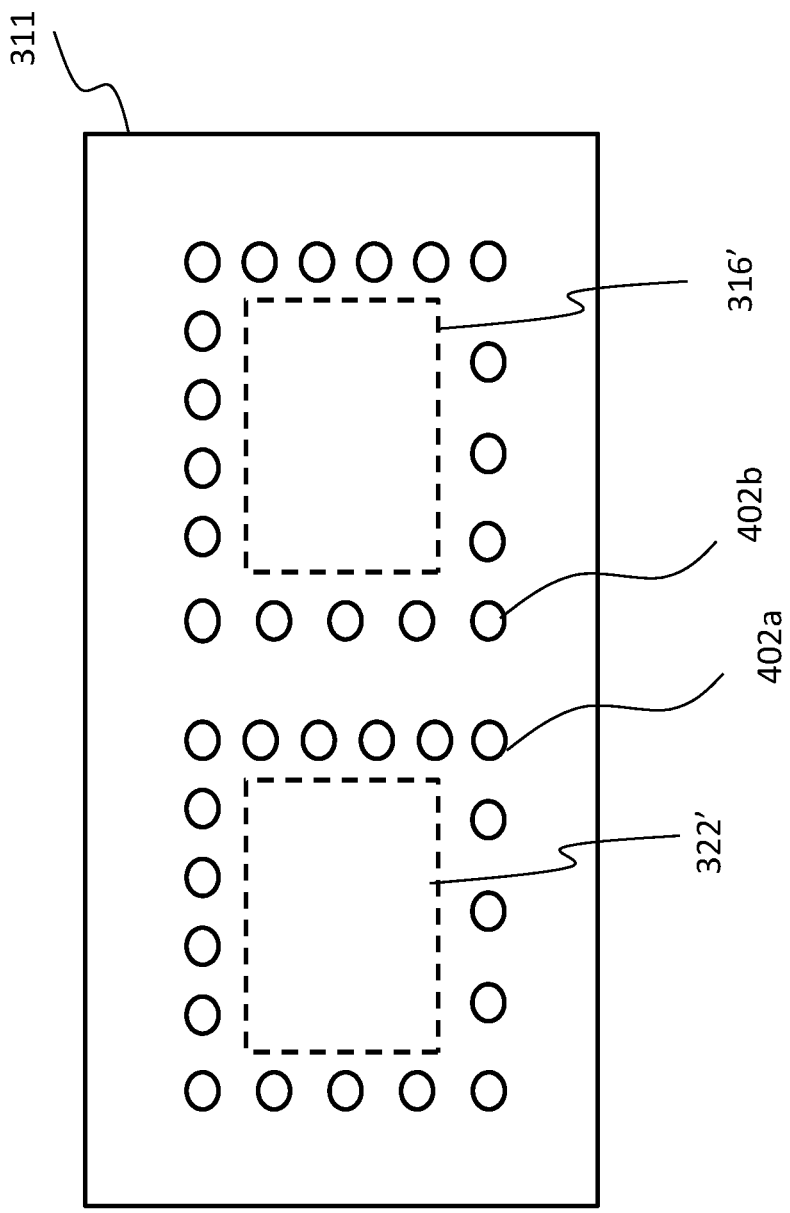

FIG. 4 shows schematically the through-holes 402*a*, 402*b*, . . . being provided around embedded chips 316, 322. The footprint 316', 322' of embedded chips 316, 322 is illustrated on third layer 311. In FIG. 4, the through-holes in the third layer are provided around the embedded chips. It is envisaged, that for the through-holes provided in the one or more shielding layer, 304, 312, it is an advantage to provide the through-holes along one or more edges of the plurality of shielding layers 304, 312 to provided an optimum shielding of the components. In some embodiments, sufficient shielding may be obtained by providing the through-holes along edges of the components 316, 322 to be shielded.

Figure 5:
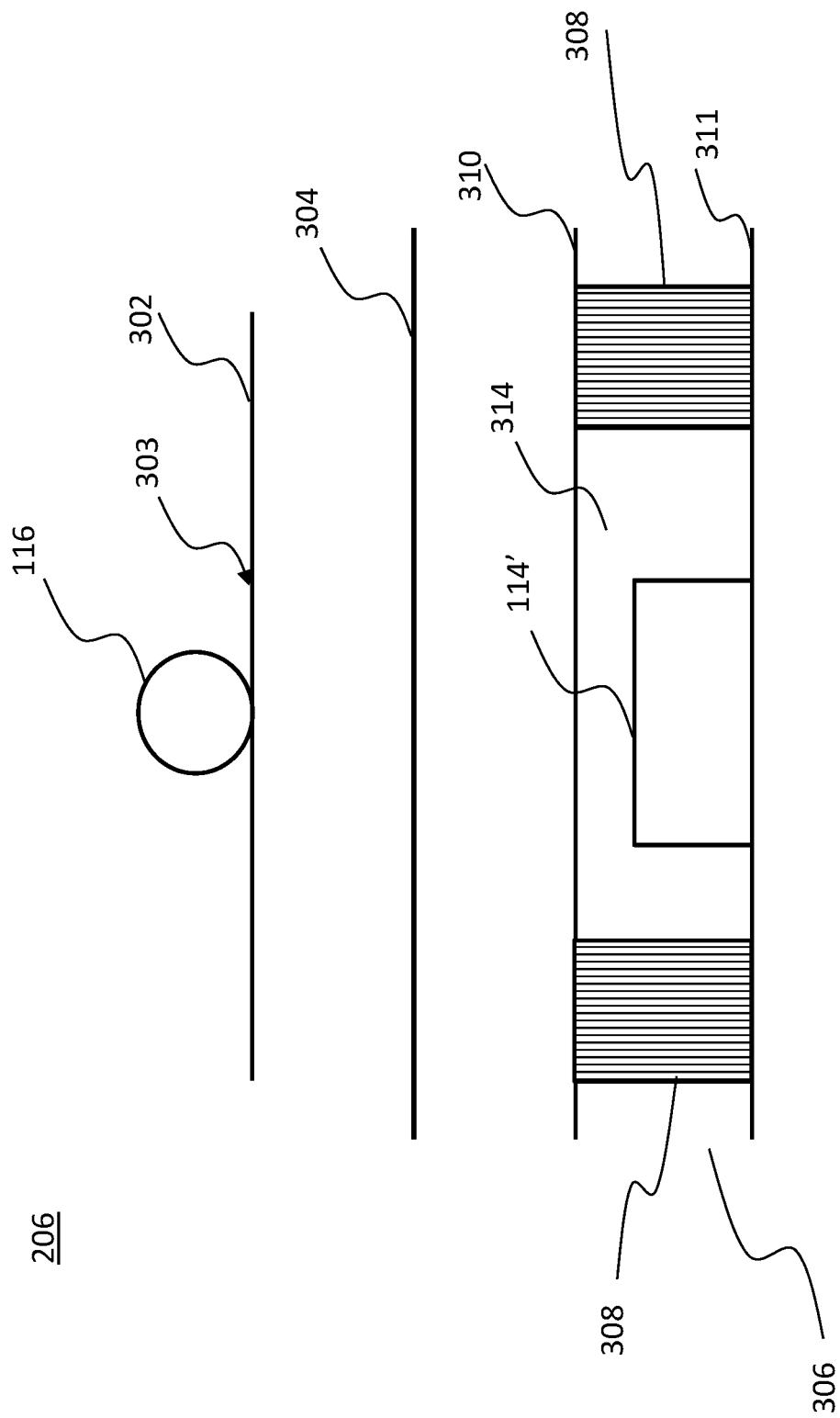

In FIG. 5, a schematic illustration of an exemplary multi-chip assembly is provided. In FIG. 5, the embedded chip 114' is the wireless communication chip (MI) 114'. The wireless communication chip (MI) 114' is provided in spacer layer 306 in the opening 314 provided by the one or more spacer elements 308. The spacer layer 306 is provided between second layer 310 and third layer 311. A shielding layer 304 is provided between the second layer 310 and the first layer 302. The magnetic induction antenna 116, in the form of a magnetic induction coil 116, is provided at the surface 303 of the first layer 302.

It is an advantage of being able to provide the wireless communication unit (MI) 114, such as the magnetic induction control chip 114' and the magnetic induction coil 116 in the same multi-chip assembly, in that the space required for the elements in the hearing device is reduced, and the length of any interconnecting wires between the wireless communication chip (MI) 114' and the magnetic induction coil 116 is reduced. By providing the shielding layer 304 below the first layer so that the shielding layer is provided between the wireless communication chip (MI) 114' and the magnetic induction coil 116 reduces noise or any other unwanted electromagnetic interference from the wireless communication chip (MI) 114' so that any influence from such noise or interference is reduced at the magnetic induction coil and thus the influence on the magnetic field generated at the magnetic induction coil is reduced.

It is envisaged that also other chips may be embedded, including e.g. the power management chip.

Figure 6:
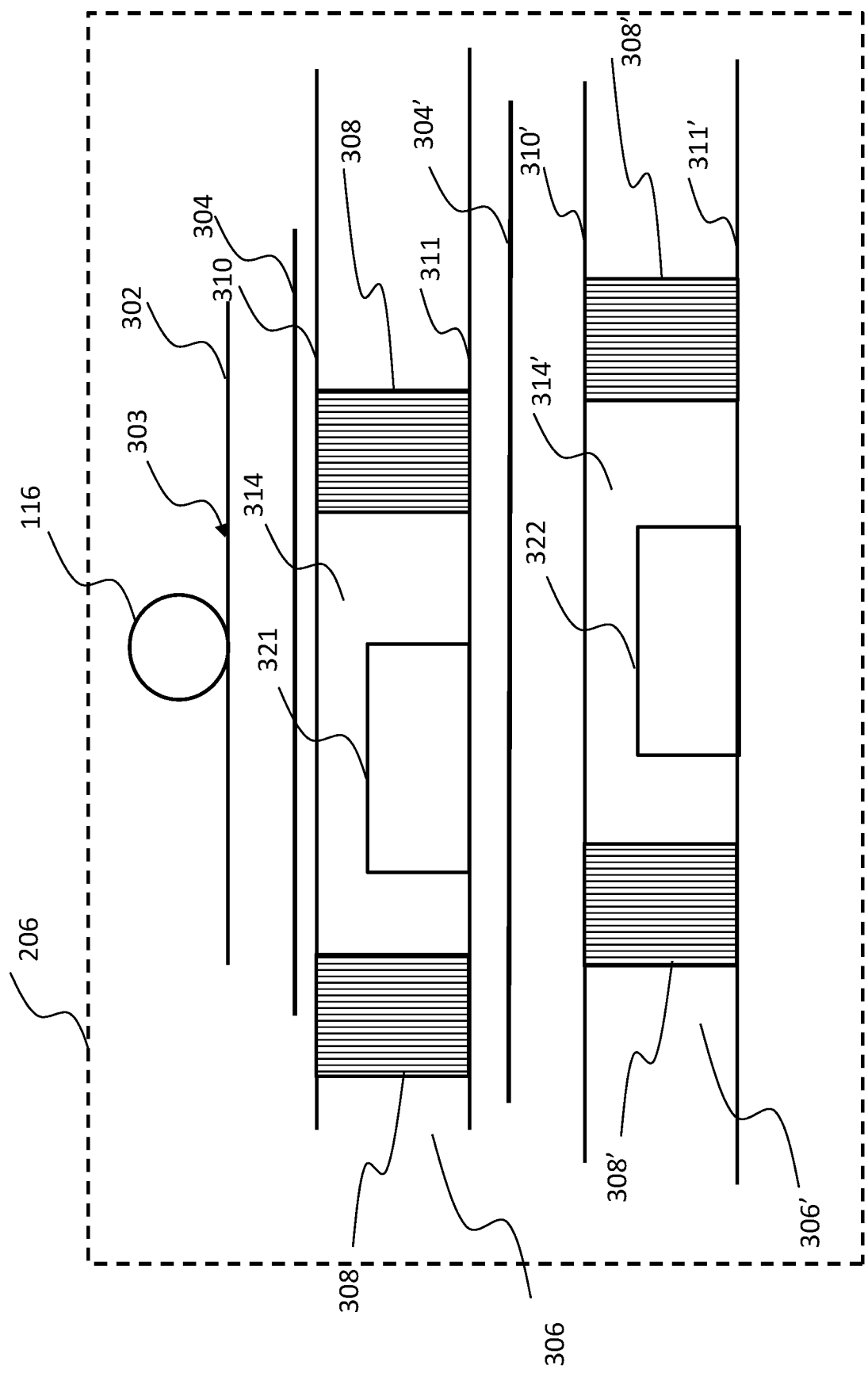

In FIG. 6, a schematic illustration of another exemplary multi-chip assembly 206 is provided. In FIG. 6, a first embedded chip 321 and a second embedded chip 322 are provided in the multi-chip assembly 206. A secondary shield, such as secondary shielding layer 304', is provided between the first embedded chip 321 and the second embedded chip 322. The multi-chip assembly comprises a plurality of layers including the first layer 302, the first layer being a top layer of the multi-chip assembly; the first layer having a surface 303, the surface 303 being configured for mounting of electronic components, and may be configured for SMT mounting of electronic components.

The first embedded chip 321 is provided in spacer layer 306, such as in the opening 314 provided by the one or more spacer elements 308. The spacer layer 306 is provided between second layer 310 and third layer 311. A shielding layer 304 is provided between the second layer 310 and the first layer 302.

The second embedded chip 322 is provided in secondary spacer layer 306', such as in the secondary opening 314' provided by one or more secondary spacer elements 308'. The secondary spacer layer 306' is provided between further layers 310' and 311'. A secondary shielding layer 304' is provided between the further layer 310' and the third layer 311. The secondary shielding layer thereby provides a shield between the first embedded chip 321 and the second embedded chip 322.

The first embedded chip and the second embedded chip may any of the power management chip 110', the wireless communication chip (RF) 108', the wireless communication chip (MI) 114', the signal processing chip 104', etc.

The magnetic induction antenna 116, in the form of a magnetic induction coil 116, may be provided at the surface 303 of the first layer 302.

It is envisaged that the secondary shield may be provided as illustrated in FIG. 6 as a shielding layer between the first embedded chip and the second embedded chip. In some embodiments, the first embedded chip and the second embedded chip may be provided in the same spacer layer. The secondary shield may be provided as part of the spacer layer. In some embodiments, the spacer elements may additionally comprise shielding elements to provide shielding between the first embedded chip and the second embedded chip.

Exemplary hearing devices are set out in the following embodiments:

1. A hearing device comprising
a multi-chip assembly including a plurality of integrated circuit chips, the plurality of integrated circuit chips including at least one of a wireless communication chip, a power management chip, and a signal processing chip,
a battery for supplying power,
the multi-chip assembly comprising:
a plurality of layers including a first layer having a surface,
a spacer layer being configured to accommodating at least one of the plurality of integrated circuit chips as an embedded chip,
a ground layer being provided below the first layer and the spacer layer,
wherein the multi-chip assembly further comprises at least one shielding layer,
including a first shielding layer, the first shielding layer being provided between the spacer layer and the first layer.
2. A hearing device according to embodiment 1, wherein the spacer layer is provided between a second layer and a third layer of the plurality of layers, wherein the ground layer is electrically insulated from at least the first layer by means of an insulating layer, and wherein a connection to the ground layer is provided via through-holes in the first layer, the spacer layer and the insulating layer.
3. A hearing device according to embodiment 2, wherein the second layer is the shielding layer, and wherein the third layer is the insulating layer.
4. A hearing device according to any of the preceding embodiments, wherein the at least one embedded chip includes the wireless communication chip and/or the power management chip.

5. A hearing device according to any of the previous embodiments, wherein the spacer layer provides an opening configured to accommodate at least one of the plurality of integrated circuit chips.

6. A hearing device according to any of the preceding embodiments, wherein the plurality of shielding layers are provided above and/or below the embedded chip, the plurality of shielding layers, including the first shielding layer, reducing electromagnetic emission from the at least one embedded chip.

7. A hearing device according to any of the preceding embodiments, wherein the multi-chip assembly comprises a first embedded chip and a second embedded chip, and wherein a shielding is provided between the first embedded chip and the second embedded chip.

8. A hearing device according to embodiment 7, wherein the first embedded chip is the power management chip and the second embedded chip is the wireless communication chip.

9. A hearing device according to any of the preceding embodiments, wherein the hearing device further comprises a magnetic induction antenna and wherein a first wireless communication chip is a magnetic induction control chip.

10. A hearing device according to any of the preceding embodiments, wherein the hearing device further comprises an RF antenna, and wherein a second wireless communication chip is an RF wireless communication chip.

11. A hearing device according to any of the preceding embodiments, wherein the multi-chip assembly comprises a multi-layer printed circuit board, PCB, or a multi-layer flexible printed circuit board, FPCB.

12. A hearing device according to any of the preceding embodiments, wherein through-holes in the plurality of shielding layers are provided along one or more edges of the plurality of shielding layers.

13. A hearing device according to any of embodiments 9-12, wherein the magnetic induction control chip is provided as an embedded chip and wherein the magnetic induction antenna is provided at the surface of the first layer, the first shielding layer and/or the further shielding layers providing a shield between the magnetic induction control chip and the magnetic induction antenna.

14. A hearing device according to any of the preceding embodiments, wherein the hearing device comprises one or more microphones configured to receive an audio signal, and wherein the one or more microphones are provided at the surface of the first layer.

15. A hearing device according to any of embodiments 1-13, wherein the hearing device comprises one or more microphones configured to receive an audio signal, and wherein the one or more microphones are provided at a carrier board, 16. A hearing device according to any of the preceding embodiments, wherein electronic components mounted on the first layer includes passive circuit components, the passive circuit components being selected from the group consisting of resistors, capacitors, inductors, transducers and diodes.

17. A hearing device according to any of preceding embodiments, wherein the battery is interconnected with the multi-chip assembly.

18. A hearing device according to any of embodiments 9-17, wherein the magnetic induction antenna has a longitudinal direction being parallel to an ear-to-ear axis of a user of the hearing device, when the hearing device is provided in the intended operational position at the ear of a user.

19. A hearing device according to any of the preceding embodiments, wherein the battery is a rechargeable battery and wherein the hearing device further comprises a rechargeable battery regulator.

20. A hearing device according to embodiment 19, wherein the rechargeable battery regulator is provided as an embedded chip.

21. A binaural hearing device system comprising a first hearing device configured to be provided at a first ear of a user and a hearing device configured to the provided at a second ear of the user, and wherein one or both of the hearing devices is/are a hearing device according to any of embodiments 1-20.

Furthermore, exemplary hearing devices are set out in the following embodiments:

1. A hearing device comprising
a multi-chip assembly including one or more integrated circuit chips, the one or more integrated circuit chips including at least one of a wireless communication chip, a power management chip, and a signal processing chip,
a battery for supplying power,
the multi-chip assembly comprising:
a plurality of layers including a first layer having a surface,
a spacer layer being configured to accommodating at least one of the one or more integrated circuit chips as an embedded chip,
a ground layer being provided below the first layer and the spacer layer,
wherein the multi-chip assembly further comprises at least one shielding layer,
including a first shielding layer, the first shielding layer being provided between the spacer layer and the first layer.

2. A hearing device according to embodiment 1, wherein the spacer layer is provided between a second layer and a third layer of the plurality of layers, wherein the ground layer is electrically insulated from at least the first layer by means of an insulating layer, and wherein a connection to the ground layer is provided via through-holes in the first layer, the spacer layer and the insulating layer.

3. A hearing device according to embodiment 2, wherein the second layer is the shielding layer, and wherein the third layer is the insulating layer.

4. A hearing device according to any of the preceding embodiments, wherein the at least one embedded chip includes the wireless communication chip and/or the power management chip.

5. A hearing device according to any of the previous embodiments, wherein the spacer layer provides an opening configured to accommodate at least one of the one or more integrated circuit chips.

6. A hearing device according to any of the preceding embodiments, wherein the plurality of shielding layers are provided above and/or below the embedded chip, the plurality of shielding layers, including the first shielding layer, reducing electromagnetic emission from the at least one embedded chip.

7. A hearing device according to any of the preceding embodiments, wherein the multi-chip assembly comprises a first embedded chip and a second embedded chip, and wherein a shielding is provided between the first embedded chip and the second embedded chip.

8. A hearing device according to embodiment 7, wherein the first embedded chip is the power management chip and the second embedded chip is the wireless communication chip.

9. A hearing device according to any of the preceding embodiments, wherein the hearing device further comprises a magnetic induction antenna and wherein a first wireless communication chip is a magnetic induction control chip.

10. A hearing device according to any of the preceding embodiments, wherein the hearing device further comprises an RF antenna, and wherein a second wireless communication chip is an RF wireless communication chip.

11. A hearing device according to any of the preceding embodiments, wherein the multi-chip assembly comprises a multi-layer printed circuit board, PCB, or a multi-layer flexible printed circuit board, FPCB.

12. A hearing device according to any of the preceding embodiments, wherein through-holes in the plurality of shielding layers are provided along one or more edges of the plurality of shielding layers.

13. A hearing device according to any of embodiments 9-12, wherein the magnetic induction control chip is provided as an embedded chip and wherein the magnetic induction antenna is provided at the surface of the first layer, the first shielding layer and/or the further shielding layers providing a shield between the magnetic induction control chip and the magnetic induction antenna.

14. A hearing device according to any of the preceding embodiments, wherein the hearing device comprises one or more microphones configured to receive an audio signal, and wherein the one or more microphones are provided at the surface of the first layer.

15. A hearing device according to any of embodiments 1-13, wherein the hearing device comprises one or more microphones configured to receive an audio signal, and wherein the one or more microphones are provided at a carrier board, 16. A hearing device according to any of the preceding embodiments, wherein electronic components mounted on the first layer includes passive circuit components, the passive circuit components being selected from the group consisting of resistors, capacitors, inductors, transducers and diodes.

17. A hearing device according to any of preceding embodiments, wherein the battery is interconnected with the multi-chip assembly.

18. A hearing device according to any of embodiments 9-17, wherein the magnetic induction antenna has a longitudinal direction being parallel to an ear-to-ear axis of a user of the hearing device, when the hearing device is provided in the intended operational position at the ear of a user.

19. A hearing device according to any of the preceding embodiments, wherein the battery is a rechargeable battery and wherein the hearing device further comprises a rechargeable battery regulator.

20. A hearing device according to embodiment 19, wherein the rechargeable battery regulator is provided as an embedded chip.

21. A binaural hearing device system comprising a first hearing device configured to be provided at a first ear of a user and a hearing device configured to the provided at a second ear of the user, and wherein one or both of the hearing devices is/are a hearing device according to any of embodiments 1-20.

Although particular features have been shown and described, it will be understood that they are not intended to limit the claimed invention, and it will be made obvious to those skilled in the art that various changes and modifications may be made without departing from the scope of the claimed invention. The specification and drawings are, accordingly to be regarded in an illustrative rather than restrictive sense. The claimed invention is intended to cover all alternatives, modifications and equivalents.

REFERENCE SIGNS LIST

100 Hearing Device
102 Microphone
104 Signal Processor
104' Signal processing chip
106 Speaker
108 Wireless communication unit
108' Wireless communication chip
110 Power management unit
110' Power management chip
112 Battery
114 Wireless communication unit (MI)
114' Wireless communication chip (MI)
116 MI Antenna
118 RF Antenna
204a, 204b microphones
206 Multi-chip assembly
208 Carrier board
210 Surface mounted components
212 Ground layer
214 Shielding layer
216 Embedded chip
217 Multi-layered structure
218 Battery contacts
220 Center axis of battery
222 First layer
224 Surface of first layer
226 Spacer layer
302 First layer
303 Surface
304 First shielding layer
306 Spacer layer
306' Secondary spacer layer
308 Spacer element
308' Secondary spacer element
310 Second layer
311 Third layer
310' 311' Further layers
312 Ground layer
314 Opening
314' Secondary opening
316 Embedded chip
316' Footprint of embedded chip
317 Insulating layer
318 Further layer
320 Surface
321 First embedded chip
322 Second embedded chip

The invention claimed is:

1. A hearing device comprising:
a multi-chip assembly including a plurality of integrated circuit chips, the plurality of integrated circuit chips including one or a combination of a wireless communication chip, a power management chip, and a signal processing chip;
wherein the multi-chip assembly comprises:
a first layer having a surface,
a spacer layer being configured to accommodate one or more of the plurality of integrated circuit chips as one or more embedded chips, and
a ground layer below the first layer and the spacer layer, and a first shielding layer between the spacer layer and the first layer.

2. The hearing device according to claim 1, further comprising an insulating layer electrically insulating the ground layer from the first layer.

3. The hearing device according to claim 2, further comprising a connection to the ground layer implemented as via through-hole(s) in the first layer, the spacer layer, and the insulating layer.

4. The hearing device according to claim 1, wherein the multi-chip assembly also comprises a second layer and a third layer, and wherein the spacer layer is between a second layer and a third layer.

5. The hearing device according to claim 1, further comprising an insulating layer, wherein the spacer layer is between the shielding layer and the insulating layer.

6. The hearing device according to claim 1, wherein the one or more embedded chips comprise the wireless communication chip and/or the power management chip.

7. The hearing device according to claim 1, wherein the first shielding layer is configured to reduce electromagnetic emission from the one or more embedded chips.

8. The hearing device according to claim 1, wherein the first shielding layer is above one of the one or more embedded chips, and wherein the hearing device further comprises a second shielding layer below the one or more embedded chips.

9. The hearing device according to claim 1, wherein the one or more embedded chips comprise a first embedded chip and a second embedded chip, and wherein the hearing device further comprises a shielding between the first embedded chip and the second embedded chip.

10. The hearing device according to claim 9, wherein the shielding is in the spacer layer.

11. The hearing device according to claim 9, wherein the first embedded chip is the power management chip and the second embedded chip is the wireless communication chip.

12. The hearing device according to claim 1, further comprising a magnetic induction antenna, wherein the wireless communication chip is a magnetic induction control chip.

13. The hearing device according to claim 12, wherein the magnetic induction antenna has a longitudinal direction that is parallel to an ear-to-ear axis of a user of the hearing device, when the hearing device is at an intended operational position with respect to an ear of the user.

14. The hearing device according to claim 12, wherein the magnetic induction control chip is one of the one or more embedded chips, and wherein the magnetic induction antenna is at the surface of the first layer; and
wherein the first shielding layer and/or another shielding layer provides a shield between the magnetic induction control chip and the magnetic induction antenna.

15. The hearing device according to claim 1, wherein the plurality of integrated circuit chips also includes an additional wireless communication chip.

16. The hearing device according to claim 15, wherein the additional wireless communication chip is a RF wireless communication chip, and wherein the hearing device further comprises a RF antenna.

17. The hearing device according to claim 1, wherein the first shielding layer comprises through-holes along one or more edges of the first shielding layer.

18. The hearing device according to claim 1, further comprising one or more microphones configured to receive an audio signal, wherein the one or more microphones are at the surface of the first layer.

19. The hearing device according to claim 1, further comprising electronic component(s) mounted on the first layer.

20. The hearing device according to claim 19, wherein the electronic component(s) comprises passive circuit component(s).

21. The hearing device according to claim 19, wherein the electronic component(s) comprises resistor(s), capacitor(s), inductor(s), transducer(s), diode(s), or a combination of the foregoing.

22. The hearing device according to claim 1, the plurality of integrated circuit chips also includes a rechargeable battery regulator, and wherein the one or more embedded chips comprise the rechargeable battery regulator.

23. The hearing device according to claim 1, further comprising a battery.

* * * * *